United States Patent [19]

MacDonald, Jr. et al.

[11] Patent Number: 5,914,864

[45] Date of Patent: Jun. 22, 1999

[54] SHOCK AND VIBRATION ATTENUATING STRUCTURE FOR AN ELECTRONIC ASSEMBLY

[75] Inventors: James D. MacDonald, Jr.; Walter M. Marcinkiewicz, both of Apex; Rahul Gupta, Cary, all of N.C.

[73] Assignee: Ericsson Inc., Research Triangle Park, N.C.

[21] Appl. No.: 08/995,388

[22] Filed: Dec. 22, 1997

[51] Int. Cl.⁶ .............................. H05K 7/02; F16M 13/00
[52] U.S. Cl. .......................... 361/752; 361/807; 361/810; 206/706; 248/560
[58] Field of Search ............................. 361/752, 807–810, 361/758, 759; 174/52.2; 211/41.17; 206/706; 220/645; 248/560; 340/686

[56] References Cited

U.S. PATENT DOCUMENTS

| | | | |
|---|---|---|---|
| 3,631,297 | 12/1971 | Conner | 361/760 |
| 4,891,734 | 1/1990 | More et al. | 361/807 |
| 5,009,311 | 4/1991 | Schenk | 206/706 |
| 5,369,399 | 11/1994 | Tribbey et al. | 340/686 |

Primary Examiner—Leo P. Picard
Assistant Examiner—Jayprakash N. Gandhi
Attorney, Agent, or Firm—Wood, Phillips, VanSanten, Clark & Mortimer

[57] ABSTRACT

A shock and vibration attenuating structure and method is provided for an electronic assembly including a distribution circuit and at least one electronic component mounted on a surface of the distribution circuit. The shock and vibration attenuating structure includes a layer of elastomer material adapted to overlay the distribution circuit and substantially conform to the at least one electronic component. The layer includes a negative image of at least part of the at least one electronic component to allow the elastomer material to envelope the at least part of the at least one electronic component, and at least one relief formed in the elastomer material. The at least one relief is spaced from the negative image of the at least one electronic component and has a predetermined size, shape, and location in the elastomer material selected to protect the electronic component from shock and vibration induced loads and deflections with the layer overlaying the electronic assembly.

16 Claims, 2 Drawing Sheets

SHOCK AND VIBRATION ATTENUATING STRUCTURE FOR AN ELECTRONIC ASSEMBLY

FIELD OF THE INVENTION

This invention relates to electronic devices, and, more particularly, to structure and a method providing shock and vibration protection for electronic components contained in electronic devices.

BACKGROUND OF THE INVENTION

Shock and vibration induced damage or performance degradation of electronic components is an ongoing problem associated with electronic assemblies. These problems become even more acute for complex electronic devices, such as cellular telephones, that contain sensitive electronic components, such as certain LCD displays and microelectronic devices or packages, and which are adapted to be hand-held and/or carried on the body of a user and, as such, are subject to a relatively harsh vibration and shock environment.

By way of example, Chip Scale Packages (CSP's) are one type of microelectronic device that are increasingly utilized in cellular telephones and that are relatively sensitive to shock and vibration. This is due, in part, to the flexible, thin layered construction of CSP's and to the manner in which CSP's are attached to a distribution circuit, such as on a printed circuit board. More specifically, CSP's are attached to distribution circuits by solder balls which form the electrical and mechanical interconnect structure. The mechanical integrity of such solder ball attachments is generally lower than for conventional leaded parts, such as Quad Flat Packs or Thin Small Outline Packages. Additionally, solder ball attachments leave relatively large spans of the CSP unsupported.

One approach to solving vibration and shock induced performance degradation and damage in CSP's is to use a polymer underfill to bond the CSP to a printed circuit board. However, this solution is less than optimum because it generally requires added processing steps and increases the difficulty of repair after the CSP is bonded to the printed circuit board, both of which increase manufacturing costs. More specifically, the use of a polymer underfill typically requires special application techniques using a special polymer compound which possesses low viscosity in an uncured state, yet cures to form a high modulus structure. The processing times required to allow the underfill to wick into the gap between a CSP and a printed circuit board, and to subsequently cure the underfill, usually involves a batch processing technique which is generally incompatible with a continuous manufacturing line. Further, after bonding, the difficulties with reworking the underfilled CSP discourages some manufacturers from implementing any rework process.

SUMMARY OF THE INVENTION

In accordance with the present invention, a shock and vibration attenuating structure is provided for an electronic assembly including a distribution circuit and at least one electronic component mounted on a surface of the distribution circuit. The shock and vibration attenuating structure includes a layer of elastomer material adapted to overlay the distribution circuit and substantially conform to the at least one electronic component. The layer includes a negative image of at least part of the at least one electronic component to allow the elastomer material to envelope the at least part of the at least one electronic component, and at least one relief formed in the elastomer material. The at least one relief is spaced from the negative image of the at least one electronic component and has a predetermined size, shape, and location in the elastomer material selected to protect the electronic component from shock and vibration induced loads and deflections with the layer overlaying the electronic assembly.

In one form, the at least one relief includes a first array of reliefs.

In one form, the reliefs of the first array are spaced around a first mass of the elastomer material overlying the negative image to at least partially decouple the first mass from the remainder of the elastomer material.

In one form, the negative image is substantially rectangular with four corners, with each of the four corners having a relief from the first array positioned adjacent the corners so that an imaginary diagonal line passes through each relief, the adjacent corner, and a diagonally opposite corner.

In one form, the negative image of the electronic component is substantially rectangular with four corners, with each of the four corners having a relief from the first array positioned adjacent the corners so that the relief is bisected by an imaginary diagonal line passing through the adjacent corner and a diagonally opposite corner.

In one form, the layer has a thickness T(i) at the location of each relief of the first array and each relief has a characteristic dimension at least equal to the thickness T(i) at the location of the relief.

In one form, the characteristic dimension of each relief is no greater than twice the thickness T(i) at the location of the relief.

In one form, each relief has a minimum characteristic dimension and is spaced from the negative image by a distance at least equal to the minimum characteristic dimension of the relief.

In one form, the distance of each relief from the negative image is no greater than twice the minimum characteristic dimension of the relief.

In one form, at least one relief is in the form of at least one hole extending completely through the layer normal to the surface of the distribution circuit and having a cross-section parallel to the surface of the distribution circuit in the shape of at least one of a square, triangle, and oval.

In one form of the invention, an electronic device is provided that includes a distribution circuit, at least one electronic component mounted on a surface of the distribution circuit, and a layer of elastomer material adapted to overlay and substantially conform to the at least one electronic component. The layer includes a negative image of at least part of the at least one electronic component to allow the elastomer material to envelope the at least part of the at least one electronic component, and at least one relief formed in the elastomer material. The at least one relief is spaced from the negative image and has a predetermined size, shape, and location in the elastomer material selected to protect the at least one electronic component from shock and vibration induced loads and deflections with the layer overlaying the electronic assembly.

In one form of the invention, a method of providing shock and vibration protection for an electronic assembly including a distribution circuit and at least one electronic component mounted on a surface of the distribution circuit is provided. The method includes the steps of applying a layer of elastomer material over the electronic assembly so that at least part of the at least one electronic component resides in a negative image of the at least part of the at least one electronic component so that the at least part of the at least one of electronic component is enveloped by the layer of elastomer material, and forming at least one relief in the elastomer material, the at least one relief being spaced from the at least one electronic component and having a predetermined size, shape, and location in the elastomer material selected to protect the electronic component from shock and vibration induced loads and deflections.

In one form, the forming step is accomplished before the applying step.

In one form, the layer of elastomer material comprises at least one of silicone elastomer gel and fluoro silicone elastomer gel.

DETAILED DESCRIPTION OF THE PREFERRED EMBODIMENT

Figure 1:
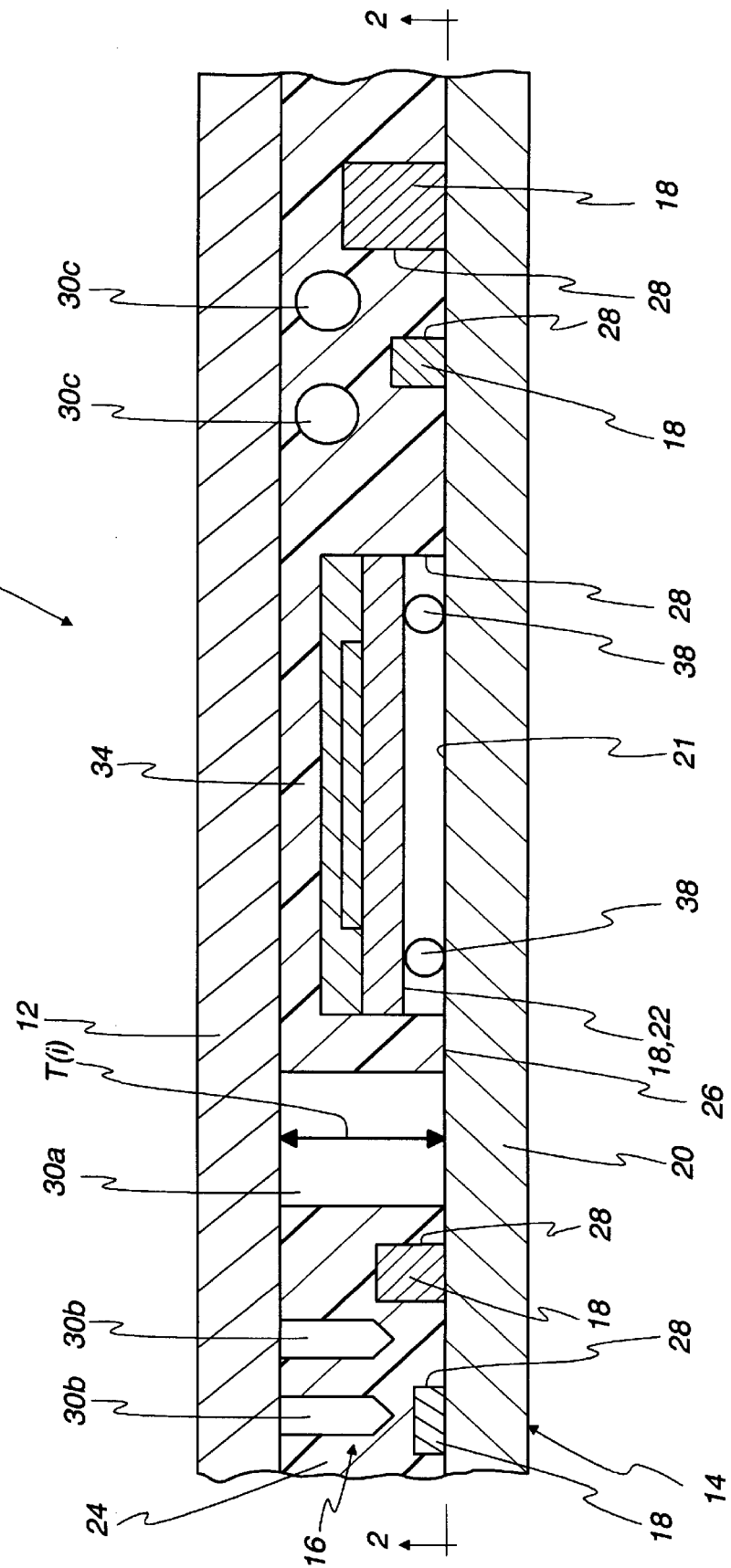
FIG. 1 is a diagrammatic, partial sectional view of an electronic device containing an electronic assembly and a shock and vibration attenuating structure embodying the present invention.

A partial cross-section of an electronic device 10 is shown in FIG. 1. The device 10 includes a housing enclosure wall or other structural wall 12, an electronic assembly 14, and a shock and vibration attenuating structure 16, embodying the present invention. The electronic assembly 14 includes a plurality of electrical components 18, such as, without limitation, resistors, capacitors, inductors, transistors, diodes, and microelectronic devices. The electronic assembly 14 further includes a distribution circuit shown in the form of a printed circuit board 20 having a surface 21 to which the components 18 are mounted. As will be explained in detail below, the structure 16 is "tuned" to provide shock and vibration protection for the electronic assembly 14 and, in particular, shock and vibration protection for at least one of the components 18, which is a critical and/or sensitive component 22.

The shock and vibration attenuating structure 16 is shown in the form of a layer 24 of elastomer material adapted to overlay and substantially conform to the electronic components 18 and the surface 21 of the circuit board 20. The layer 24 includes a surface 26 having negative images 28 of each of the electronic components 18 to allow the elastomer material to envelope the electronic components 18. The negative images 28 may be formed by any conventional method for forming such shapes into elastomer material. One preferred method is to pre-cast the negative images 28 into the layer 24. Another possible method would be to form the negative images in place on the assembly 14 as the layer 24 is overlaid on the electronic assembly 14.

The layer 24 further includes a plurality of reliefs 30 that are formed in the elastomer material, with the configuration (shape, size, and position) of the reliefs 30 in the layer 24 being selected to "tune" the dynamic response of the electronic assembly 14 in combination with the structure 16 by adjusting the natural frequencies for the combination of the electronic assembly 14 and the structure 16 to avoid resonant frequencies with any anticipated forcing frequency. The configuration of the reliefs 30 is also selected to reduce and/or redistribute shock and vibration induced loads and deflections. The layer 24 has a thickness T(i) at each of the reliefs 30 that may vary from relief 30 to relief 30.

Figure 2:
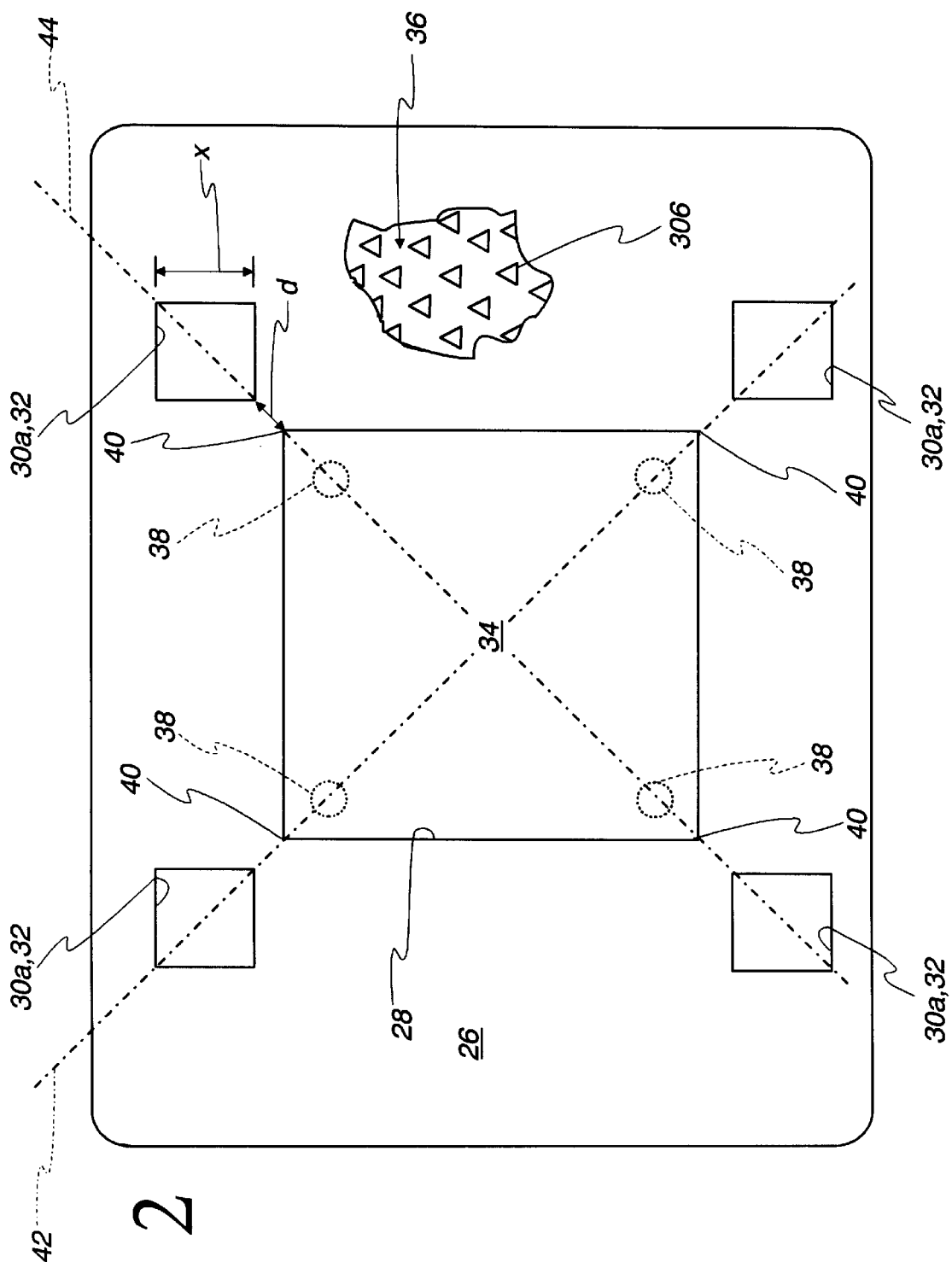
FIG. 2 is a diagrammatic, plan view taken along line 2—2 of FIG. 1. showing only selected features of the shock and vibration attenuating structure shown in FIG. 1.

The precise configuration of the reliefs 30 can be selected based on the results from modeling and simulation techniques commonly employed by those skilled in the art. One approach is to model the combination of the structure 16 and the electronic assembly 14 as a "lumped" spring, mass, damper system, with each critical and/or sensitive electronic component 22 defining a location for one of the "lumped" masses and the remainder of the electronic assembly 14 defining another of the "lumped" masses. As seen in FIG. 2, which illustrates selected features of the structure 16, this approach is facilitated by arranging a first array 32 of a first form of the reliefs 30a around a first mass 34 of the elastomer gel that overlies the negative image 28 of the major or critical component 22 to at least partially decouple the first mass 34 from the remainder of the elastomer material. This allows for the first mass 34 and the critical component 22 to be modeled as a lumped mass. Additionally, the first mass 34 may be further decoupled from the remainder of the elastomer material by providing a second array 36 of another form of the reliefs 30b in a uniform repetitive pattern in the elastomer material spaced from and surrounding the negative image 34.

While the specific cross-sectional shape of the reliefs 30 normal to the surface 21 of the distribution circuit 20 will be highly dependent upon the modeling and simulation results for any particular electronic assembly 14, it is believed that a square cross-section is preferred for reliefs 30 that are located in areas that experience primarily compression forces; elliptical or oval cross-sections are preferred for reliefs 30 located in areas that experience primarily tension forces; and triangular cross-sections are preferred for reliefs 30 in areas experiencing a mix of compression and tension forces. Each of these cross-sections can be described as having a "characteristic dimension". For example, the characteristic dimension for a square cross-section would be the length of any side of the square. For triangles, the characteristic dimension would be the length of the longest side of the triangle. For elliptical or oval cross-sections, the critical dimension would be the length of their major axes.

The critical component 22 is shown in the form of a microelectronic device commonly referred to as a Chip Scale Package (CSP) that is attached to the printed circuit board 20 by a plurality of discrete mechanical connections 38, shown in the form of solder balls. For electronic components 18, such as the CSP 22, having a plurality of discrete mechanical connections 38, it is desirable to utilize the layer 24 to normalize the stress in the component 18 by redistributing or redirecting shock and vibration induced loads away from the connections 38 to minimize the stresses in the areas of the component 22 adjacent the connections 38. To this end, it is preferred to configure the first array of reliefs 30a as shown in FIG. 2, which illustrates selected features of the structure 16 with the electronic assembly removed. More specifically, each of the reliefs 30a has a minimum characteristic dimension that is at least as great as the thickness T(i) of the layer 24 at the location of the relief 30a, but no greater than two times the thickness T(i). Further, it is preferred that each of the reliefs 30a be spaced from the negative image 28 by a distance (d) that is at least equal to the minimum characteristic dimension X of the relief 30a and no greater than two times the minimum characteristic dimension X. Further, it is preferred that each relief 30a extend through the entire thickness T(i) of the layer 24 at the location of the relief 30a. When the negative image is substantially rectangular with the connections 38 located adjacent four corners 40, as shown in FIG. 2, it is preferred that each of the four corners 40 have a relief 30a positioned adjacent the corner so that the relief 30a is bisected by an imaginary diagonal line 42, 44 passing through the adjacent corner and a diagonally opposite corner of the negative image. Further, it is preferred that the reliefs 30a have a square cross-section parallel to the surface 21. It is also preferred that the layer 24 have a sufficient thickness to fill the space between the electronic assembly 14 and the enclosure wall 12. This provides additional support for the structure 16 and the electronic assembly 14, and enhances thermal conduction from the electronic assembly 14 through the structure 16.

While it is preferred that the reliefs 30 extend through the entire thickness T(i) of the layer 24 at the location of the relief 30, it may be advantageous in some applications for the reliefs 30 to extend through less than the entire thickness T(i) of the layer 24, as shown by reliefs 30b in FIG. 1. Further, it may be advantageous in some application to provide reliefs 30 that are completely encapsulated in the layer 24, as shown by reliefs 30c in FIG. 1.

It is preferred that the layer 24 of elastomer material be formed from silicone elastomer gel or fluoro silicone elastomer gel having dielectric properties selected so as to not degrade the performance of the electronic assembly 14, while also having sufficient structural stability to prevent unacceptable flow of the elastomer gel over an anticipated temperature range for the electronic assembly 14. These materials are preferred because of their inherent damping properties and relatively low modulus. Additionally, these materials are preferred due to the ability to create intimate contact with adjoining surfaces because of the materials inherent ability to "wet" a surface. This allows these materials to provide a relatively high thermoconductivity without requiring a large compression force between the material and an abutting surface. It is further preferred that the elastomer gel material have a thermal conductivity that is enhanced by using alumina, boron nitride, or aluminum nitride additives. It is preferred that these additives be 60% to 80% by volume of the elastomer gel to optimize the thermal conductivity of the layer 24. Suitable silicone elastomer gel material may be purchased from Raychem Corporation, Electronics Division, 300 Constitution Drive, Menlo Park, Calif., 94025-1164 under several trade names including GelTek™, HeatPath™ and ThermoFit™. Suitable fluoro silicone elastomer gel material may be purchased from the Dow Chemical Company, 2030 Dow Center, Midland, Mich. 48674.

We claim:

1. A shock and vibration attenuating structure for an electronic assembly comprising a distribution circuit and at least one electronic component mounted on a surface of the distribution circuit, the shock and vibration attenuating structure comprising:

a layer of elastomer material adapted to overlay a distribution circuit and at least one electronic component mounted on a surface of the distribution circuit, the layer comprising
  a) a negative image of at least part of the at least one electronic component to allow the elastomer material to envelope the at least part of the at least one electronic component,
  b) a first array of reliefs formed in the elastomer material and having a first configuration, each relief of the first array having a predetermined size, shape, and location in the elastomer material selected to protect the at least one electronic component from shock and vibration induced loads and deflections with the layer overlaying the electronic assembly, and
  c) a second array of reliefs formed in the elastomer material and having a second configuration different than the first configuration, each relief of the second array having a predetermined size shape, and location in the elastomer material selected to protect the at least one electronic component from shock and vibration induced loads and deflections with the layer overlaying the electronic assembly.

2. A shock and vibration attenuating structure for an electronic assembly comprising a distribution circuit and at least one electronic component mounted on a surface of the distribution circuit the shock and vibration attenuating structure comprising:
  a) a layer of elastomer material adapted to overlay a distribution circuit and substantially conform to at least one electronic component mounted on a surface of the distribution circuit the layer comprising:
    (i) a negative image of at least part of the at least one electronic component to allow the elastomer material to envelope the at least part of the at least one electronic component, and
    (ii) at least one relief formed in the elastomer material the at least one relief being spaced from the negative image and having a predetermined size, shape, and location in the elastomer material selected to protect the at least one electronic component from shock and vibration induced loads and deflections with the layer overlying the electronic assembly, wherein the reliefs of the at least one relief comprises a first array of reliefs that are spaced around a first mass of the elastomer material overlying the negative image to at least partially decouple the first mass from the remainder of the elastomer material.

3. The shock and vibration attenuating structure of claim 2 wherein the negative image is substantially rectangular with four corners, each of the four corners having a relief from the first array positioned adjacent the corner so that an imaginary diagonal line passes through each relief, the adjacent corner, and one of the four corners that is diagonally opposite to the adjacent corner.

4. The shock and vibration attenuating structure of claim 2 wherein the negative image of the electronic component is substantially rectangular with four corners, each of the four corners having a relief from the first array positioned adjacent the corner so that each relief is bisected by an imaginary diagonal line passing through the adjacent corner and one of the four corners that is diagonally opposite to the adjacent corner.

5. The shock and vibration attenuating structure of claim 2 wherein the layer has a thickness T(i) at the location of each relief of the first array and each relief has a characteristic dimension at least equal to the thickness T(i) at the location of the relief.

6. The shock and vibration attenuating structure of claim 5 wherein the characteristic dimension of each relief is no greater than twice the thickness T(i) at the location of the relief.

7. The shock and vibration attenuating structure of claim 2 wherein each relief has a minimum characteristic dimension and is spaced from the negative image by a distance at least equal to the minimum characteristic dimension of the relief.

8. The shock and vibration attenuating structure of claim 7 wherein the distance of each relief from the negative image is no greater than twice the minimum characteristic dimension of the relief.

9. A shock and vibration attenuating structure for an electronic assembly comprising a distribution circuit and at least one electronic component mounted on a surface of the distribution circuit the shock and vibration attenuating structure comprising:

a layer of elastomer material adapted to overlay a distribution circuit and substantially conform to at least one electronic component, the layer comprising:

a) a negative image of at least part of the at least one electronic component to allow the elastomer material to envelope the at least part of the at least one electronic component, and b) at least one relief formed in the elastomer material, the at least one relief being spaced from the negative image and having a predetermined size, shape, and location in the elastomer material selected to protect the at least one electronic component from shock and vibration induced loads and deflections with the layer overlaying the electronic assembly, wherein the at least one relief is in the form of at least one hole extending completely through the layer normal to the surface of the distribution circuit and having a cross section parallel to the surface in the shape of at least one of a square, triangle, and oval.

10. A shock and vibration attenuating structure comprising:

an electronic assembly comprising a distribution circuit and at least one electronic component mounted on a surface of the distribution circuit;

a layer of elastomer material adapted to overlay the distribution circuit and substantially conform to the at least one electronic component, the layer comprising a) a negative image of at least part of the at least one electronic component to allow the elastomer material to envelope the at least part of the at least one electronic component, and b) at least one relief formed in the elastomer material, the at least one relief being spaced from the negative image and having a predetermined size, shape, and location in the elastomer material selected to protect the at least one electronic component from shock and vibration induced loads and deflections with a layer overlaying the electronic assembly.

11. The shock and vibration attenuating structure of claim 1 wherein the layer comprises elastomer gel.

12. The shock and vibration attenuating structure of claim 11 wherein the layer comprises at least one of silicon elastomer gel and fluoro silicone elastomer gel.

13. An electronic device comprising:

a distribution circuit;

at least one electronic component mounted on a surface of the distribution circuit; and a layer of elastomer material adapted to overlay the distribution circuit and the at least one electronic component, the layer comprising a) a negative image of at least part of the at least one electronic component to allow the elastomer material to envelope the at least part of the at least one electronic component, and b) a first array of reliefs formed in the elastomer material, the reliefs of the first array being spaced around a first mass of the elastomer material overlying the negative image and having a predetermined size, shape, and location in the elastomer material selected to at least partially decouple the first mass from the remainder of the elastomer material.

14. A method of providing shock and vibration protection for an electronic assembly comprising a distribution circuit and at least one electronic component mounted on a surface of the distribution circuit, the method comprising the steps of:

applying a layer of elastomer material over an electronic assembly so that at least part of at least one electronic component resides in a negative image of the at least part of the at least one electronic component so that the at least part of the at least one of electronic component is enveloped by the layer of elastomer material; and forming a first array of reliefs in the elastomer material, the reliefs of the first array being spaced around a first mass of the elastomer material overlying the at least one electronic component and having a predetermined size, shape, and location in the elastomer material selected to at least partially decouple the first mass from the remainder of the elastomer material.

15. The method of claim 14 wherein the forming step is accomplished before the applying step.

16. A method of providing shock and vibration protection for an electronic assembly comprising a distribution circuit and at least one electronic component mounted on a surface of the distribution circuit, the method comprising the steps of:

a) applying a layer of elastomer material over an electronic assembly so that at least part of at least one electronic component is enveloped by the layer of elastomer material; and b) forming first and second arrays of reliefs in the elastomer material, with the reliefs of the first array having a first configuration and the reliefs of the second array having a second configuration different than the first configuration, each of the reliefs of the first and second array having a predetermined size, shape, and location in the elastomer material selected to protect the at least one electronic component from shock and vibration induced loads and deflections.

* * * * *